(12) United States Patent
Ahmed et al.

(10) Patent No.: US 11,527,683 B2
(45) Date of Patent: Dec. 13, 2022

(54) LASER PRINTING OF COLOR CONVERTER DEVICES ON MICRO LED DISPLAY DEVICES AND METHODS

(71) Applicant: SAMSUNG ELECTRONICS CO. LTD., Suwon-si (KR)

(72) Inventors: Khaled Ahmed, Anaheim, CA (US); Anup Pancholi, Hillsboro, OR (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 917 days.

(21) Appl. No.: 16/157,179

(22) Filed: Oct. 11, 2018

(65) Prior Publication Data

US 2020/0119235 A1   Apr. 16, 2020

(51) Int. Cl.
*H01L 33/50* (2010.01)
*H01L 27/15* (2006.01)
*H01L 27/32* (2006.01)

(52) U.S. Cl.
CPC .......... *H01L 33/505* (2013.01); *H01L 27/156* (2013.01); *H01L 27/322* (2013.01); *H01L 27/3244* (2013.01); *H01L 2227/326* (2013.01); *H01L 2933/0041* (2013.01)

(58) Field of Classification Search
CPC . H01L 27/156; H01L 27/322; H01L 27/3244; H01L 2227/326; H01L 2933/0041; H01L 33/502; H01L 33/52; H01L 33/507; H01L 33/62; H01L 25/0753; H01L 25/167; H01L 51/5253; H01L 51/5271; H01L 33/50–508
See application file for complete search history.

(56) References Cited

U.S. PATENT DOCUMENTS

2015/0171287 A1* 6/2015 Matsumura ........... H01L 33/507 438/27
2015/0340346 A1* 11/2015 Chu ........................ H01L 33/50 257/89

* cited by examiner

*Primary Examiner* — Wasiul Haider
(74) *Attorney, Agent, or Firm* — Sughrue Mion, PLLC

(57) ABSTRACT

Embodiments disclosed herein include micro light emitting device (LED) display panels and methods of forming such devices. In an embodiment, a display panel includes a display backplane substrate, a light emitting element on the display backplane, a transparent conductor over the light emitting element, a dielectric layer over the transparent conductor, and a color conversion device over the light emitting element. In an embodiment, the dielectric layer separates the transparent conductor from the color conversion device.

8 Claims, 19 Drawing Sheets

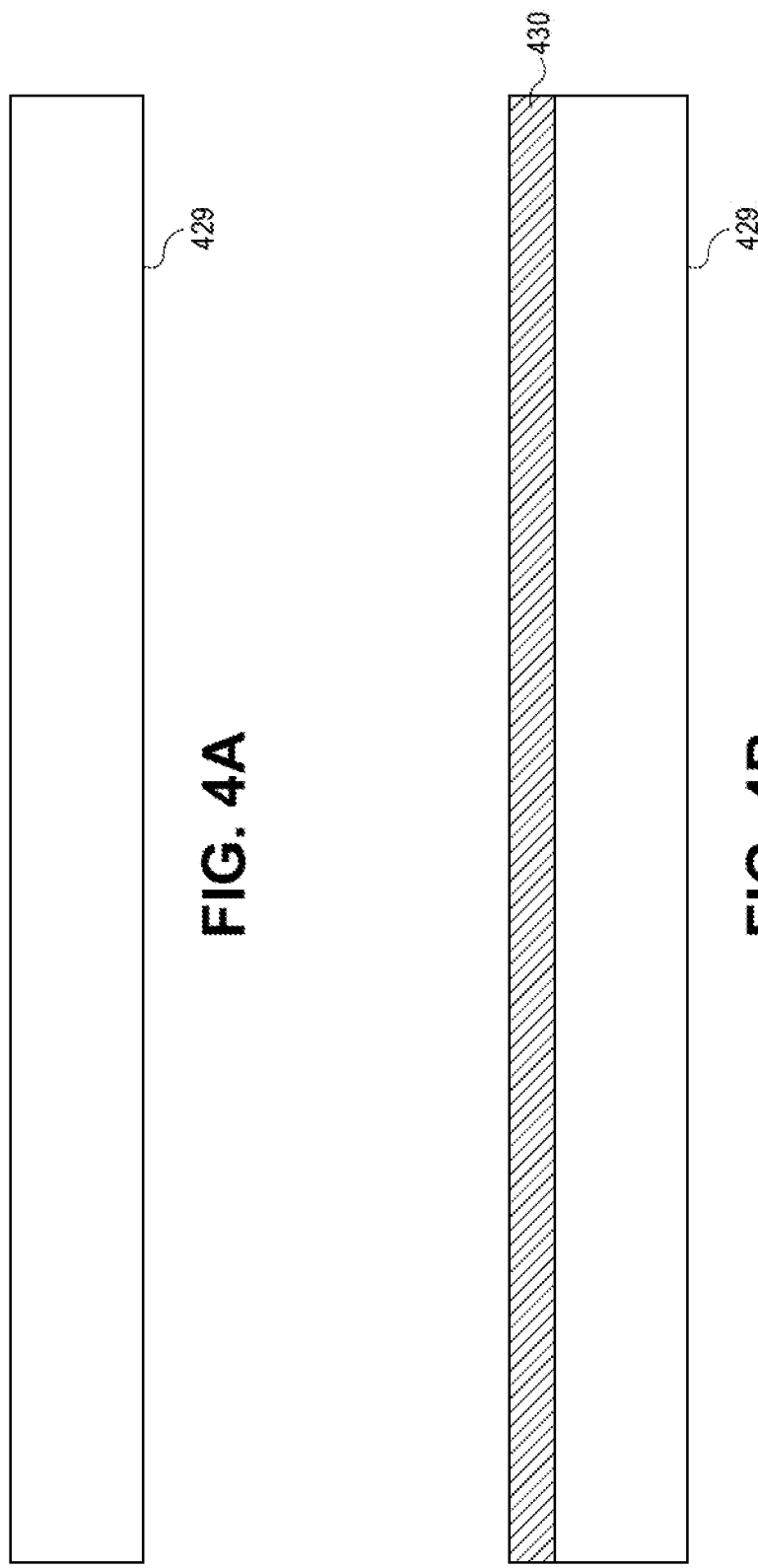

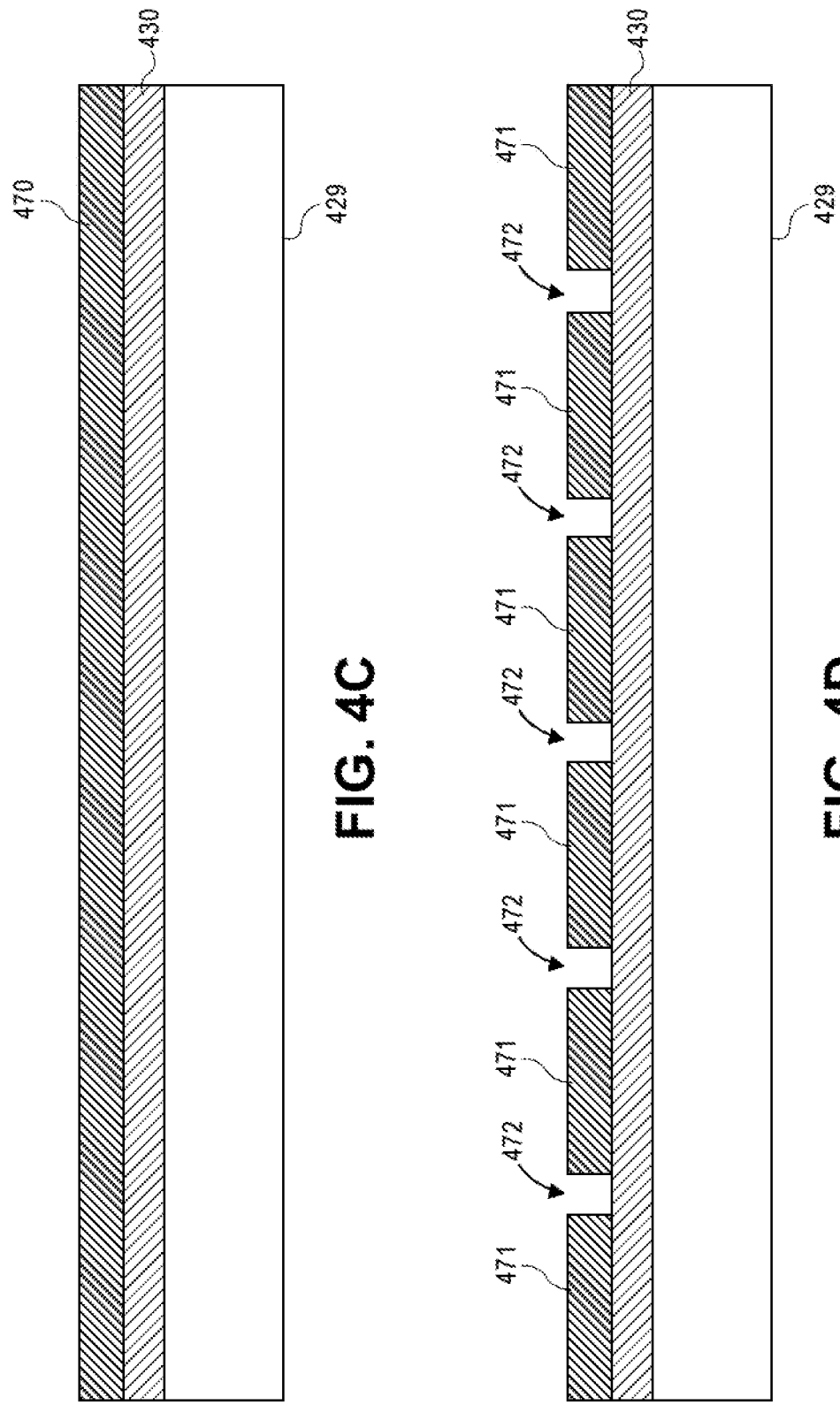

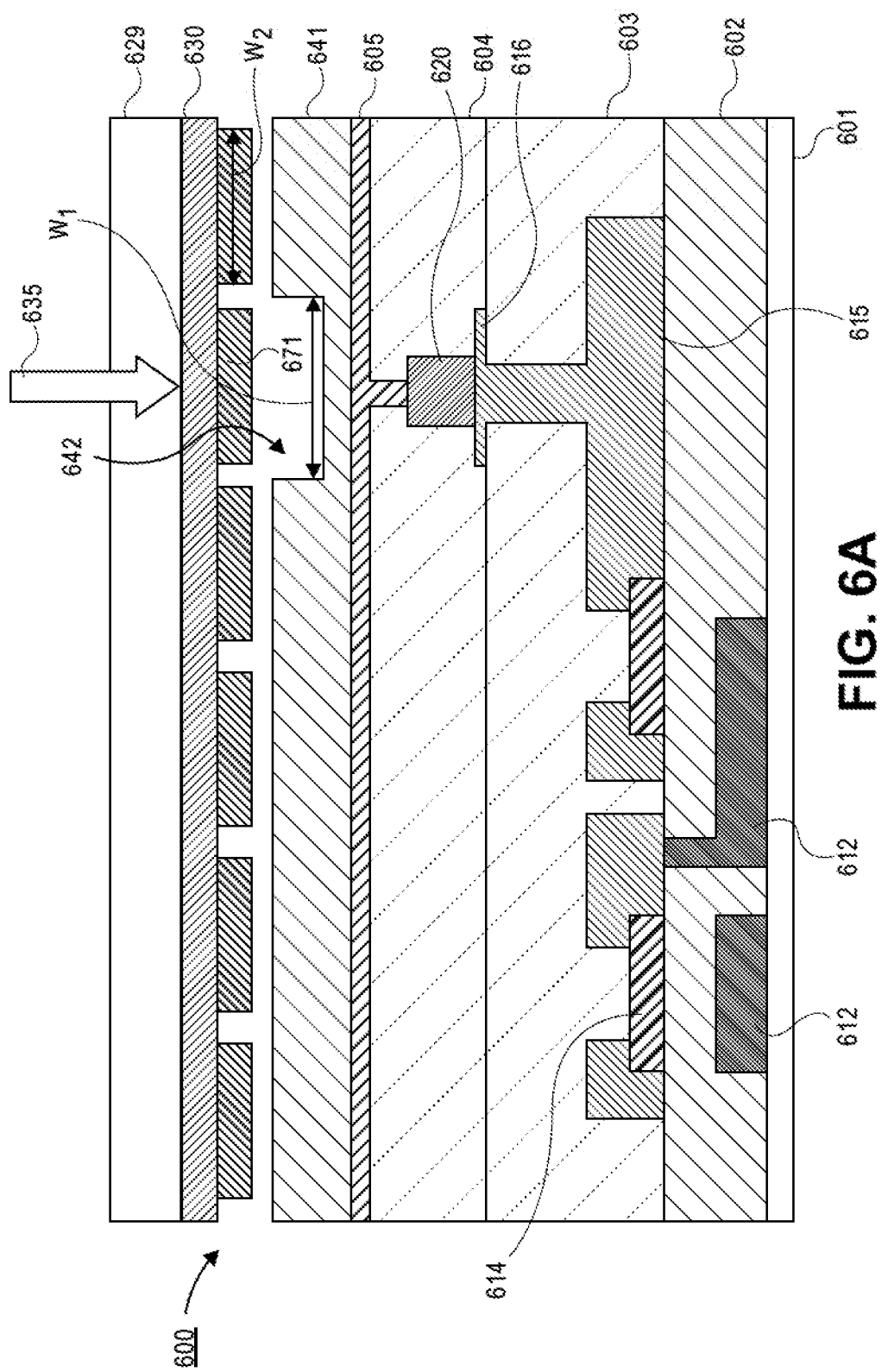

LASER PRINTING OF COLOR CONVERTER DEVICES ON MICRO LED DISPLAY DEVICES AND METHODS

TECHNICAL FIELD

Embodiments of the disclosure are in the field of micro-LED displays.

BACKGROUND

Displays having micro-scale light-emitting diodes (LEDs) are known as micro-LED, mLED, and µLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIGS. 4A-4D are cross-sectional illustrations depicting a method of fabricating a plurality of color conversion devices on a carrier substrate, in accordance with an embodiment.

FIGS. 6A-6C are cross-sectional illustrations depicting a method of transferring a color conversion device from a carrier substrate to a display backplane substrate, in accordance with an embodiment.

DESCRIPTION OF THE EMBODIMENTS

Figure 1:
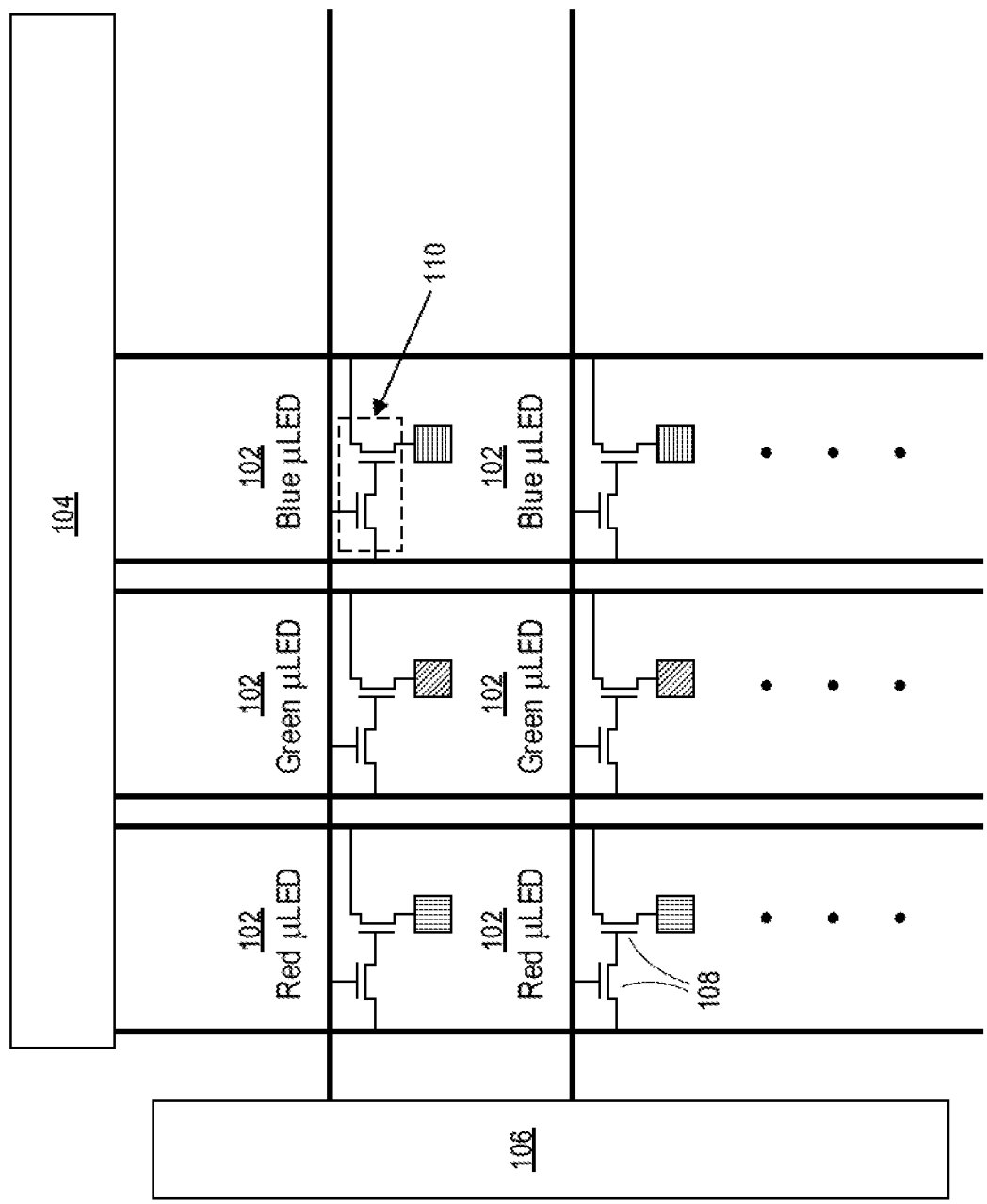
FIG. 1 is a schematic illustration of a display architecture, in accordance with an embodiment.

A micro light-emitting diode (LED) display, its fabrication and assembly are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and methods for micro LED assembly. In an embodiment, a device and method for fabricating full-color micro light emitting diode (µLED) displays by selectively transferring color conversion devices are described. Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches or greater. In certain embodiments described herein, displays may be fabricated on large glass substrates (e.g., Gen 5, Gen 6, Gen 7, Gen 8, Gen 9, Gen 10, or larger).

FIG. 1 is a schematic illustration of a display architecture, in accordance with an embodiment of the present disclosure. Referring to FIG. 1, micro LED subpixels 102 are arranged in a matrix. The micro LED subpixels 102 are driven through "Data Driver" 104 and "Scan Driver" 106 chips. Thin film transistors 108 are used to make "pixel driver circuits" 110 for each micro LED subpixels 102. In an embodiment, the micro LED subpixels 102 are fabricated on a silicon wafer then transferred to a glass substrate called "backplane" where the "pixel driver circuits" 110 have been fabricated using thin film transistors. As will be described in greater detail below, one or more of the micro LED subpixels 102 may comprise color conversion devices to improve the efficiency of the display.

Figure 2:
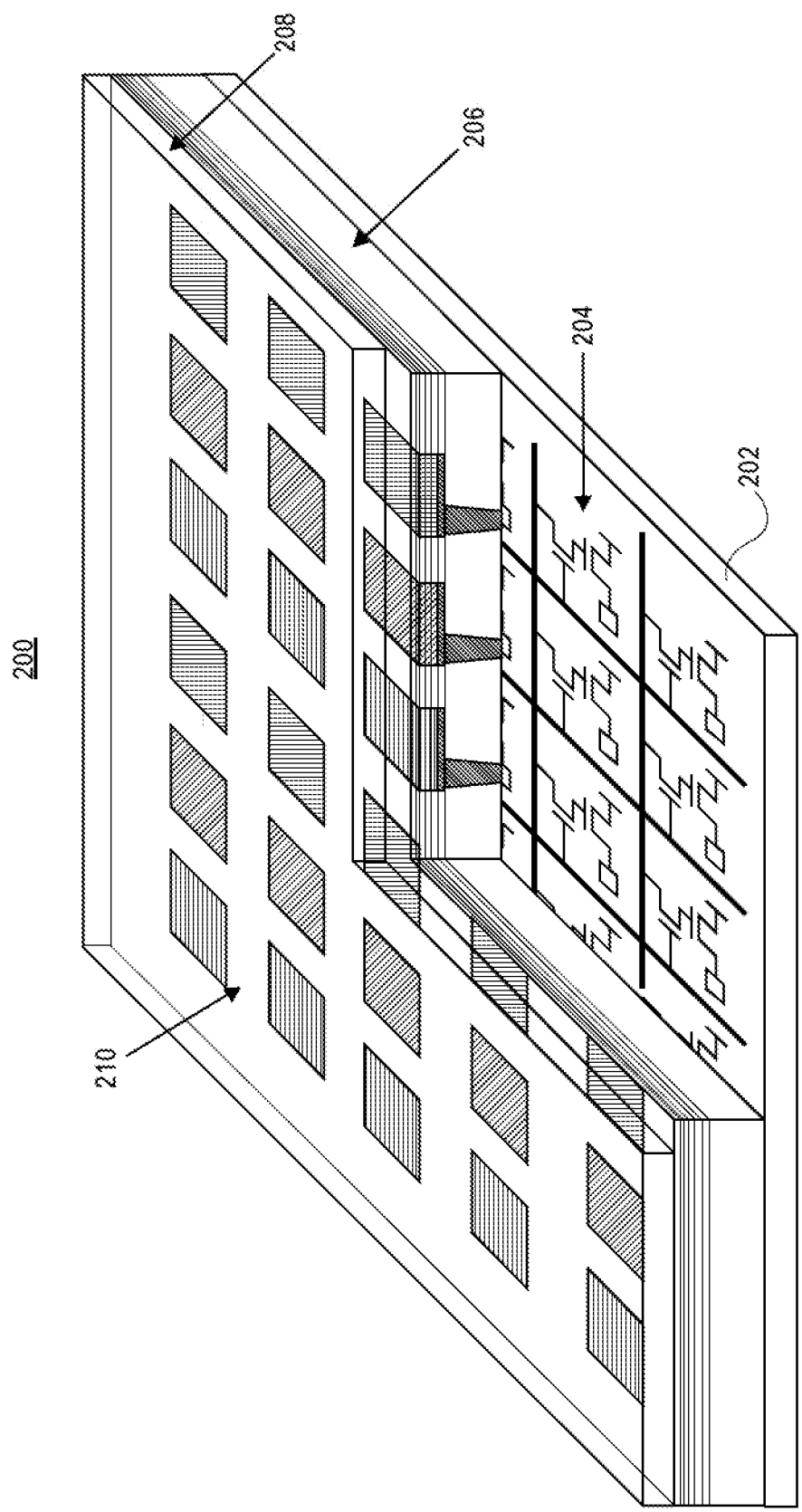
FIG. 2 is a schematic illustration of a micro-light emitting diode (LED) display architecture, in accordance with an embodiment.

As an exemplary display architecture, FIG. 2 illustrates a schematic of micro LED display architecture, in accordance with an embodiment of the present disclosure. Referring to FIG. 2, a micro LED display 200 includes a backplane 202 having pixel circuits 204 thereon. An insulator 206 is over the pixel circuits 204. Micro LED layers 208 are included over the insulator 206. A transparent electrode 210 is over the micro LED layers 208. As will be described in greater detail below, one or more subpixels in the micro LED layers 208 may comprise color conversion devices to improve the efficiency of the display.

While micro LED displays provide power savings compared to other technologies (such as OLED), further efficiencies are still desired. For example, in terms of manufacturing simplicity it is desirable to fabricate micro LEDs for all subpixel colors (e.g., red, green, and blue) on a single wafer. GaN based devices provide this flexibility. However, the efficiency of each color micro LED is not uniform in GaN based devices. Currently, the efficiency of red GaN LEDs is approximately 10× lower than desired.

Accordingly, color conversion devices (e.g. quantum dots or nanophosphors) are proposed to convert blue light to other colors (e.g., red, green, orange, etc.) with excellent efficiency. However, the current deposition methods of quantum dots are either too expensive or they lack the desired precise selective deposition on top of micro LEDs. For example, in inkjet printing, the material (quantum dots or nanophosphors) to be deposited is combined with a solvent or binder and is squirted onto a substrate at pre-specified coordinates on the display area. The solvent or binder must later be removed by a drying or curing process, which limits the flexibility and capability of this approach. In addition, wet techniques that includes inkjet printing are inherently limited by viscoelastic properties of the fluid in which the particles are suspended or dissolved.

Additionally, current approaches of forming color conversion devices are expensive because much of the color conversion material is wasted. An example of such a wasteful process is shown in FIGS. 3A and 3B.

Figure 3A:
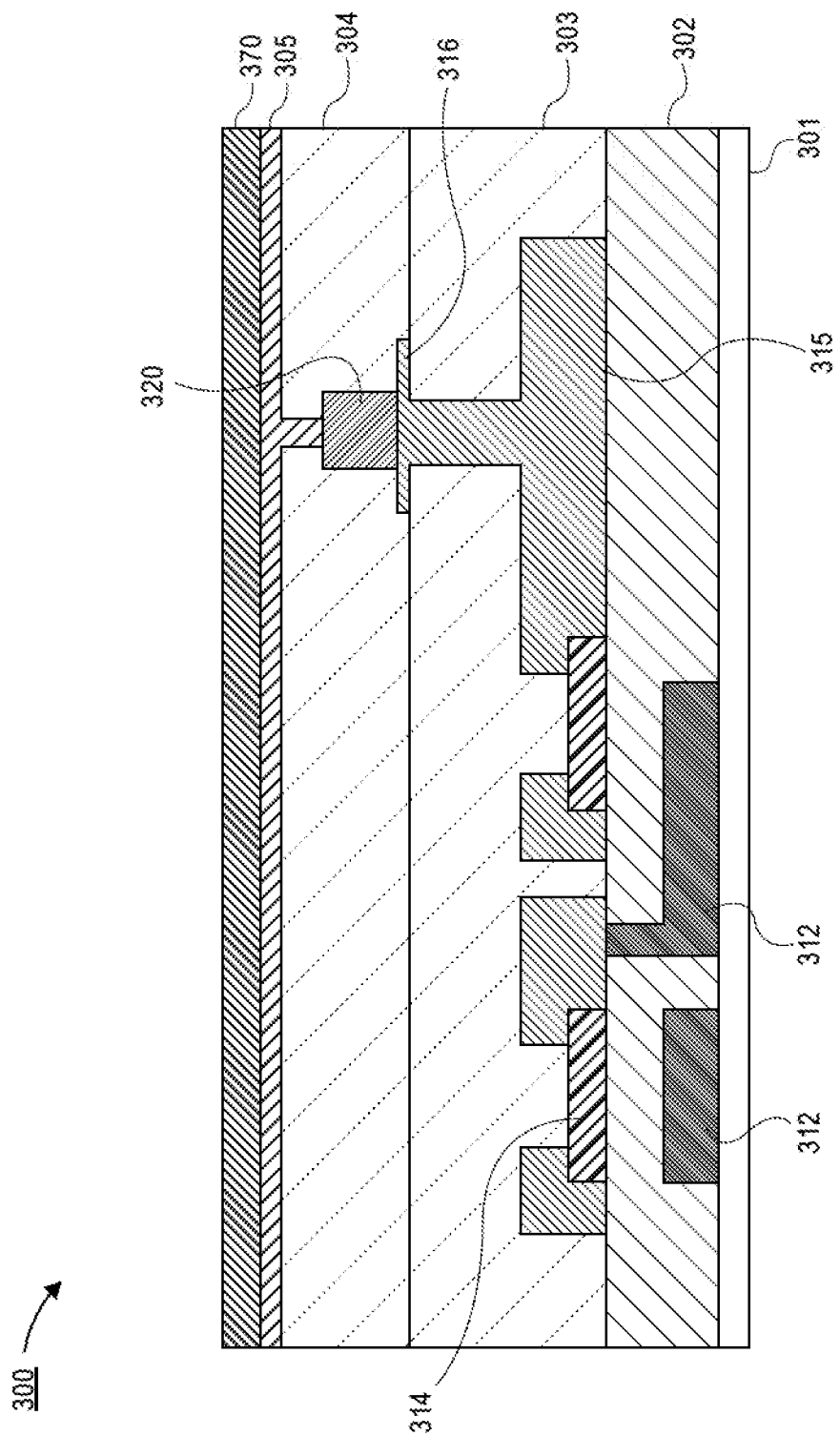
FIGS. 3A-3B are cross-sectional illustrations depicting a method of forming a color conversion device over a micro-LED with a subtractive process.

Referring now to FIG. 3A, a display backplane 300 is shown. The display backplane 300 may comprise a glass substrate 301 with pixel circuitry (e.g., gates 312 (surrounded by a gate oxide 302), thin film transistor (TFT) channels 314, and interconnects 315 in a dielectric 303) connected to a micro LED 320 on a reflective pad 316. The micro LED 320 may be surrounded by a dielectric 304 and connected to a transparent conductor 305 (e.g., indium tin oxide (ITO)). As shown, a color conversion material layer 370 is blanket deposited over the transparent conductor 305. For example, the color conversion material layer 370 may be deposited with a spin coating process. Such processes are wasteful since much of the material is spun off of the device.

Figure 3B:
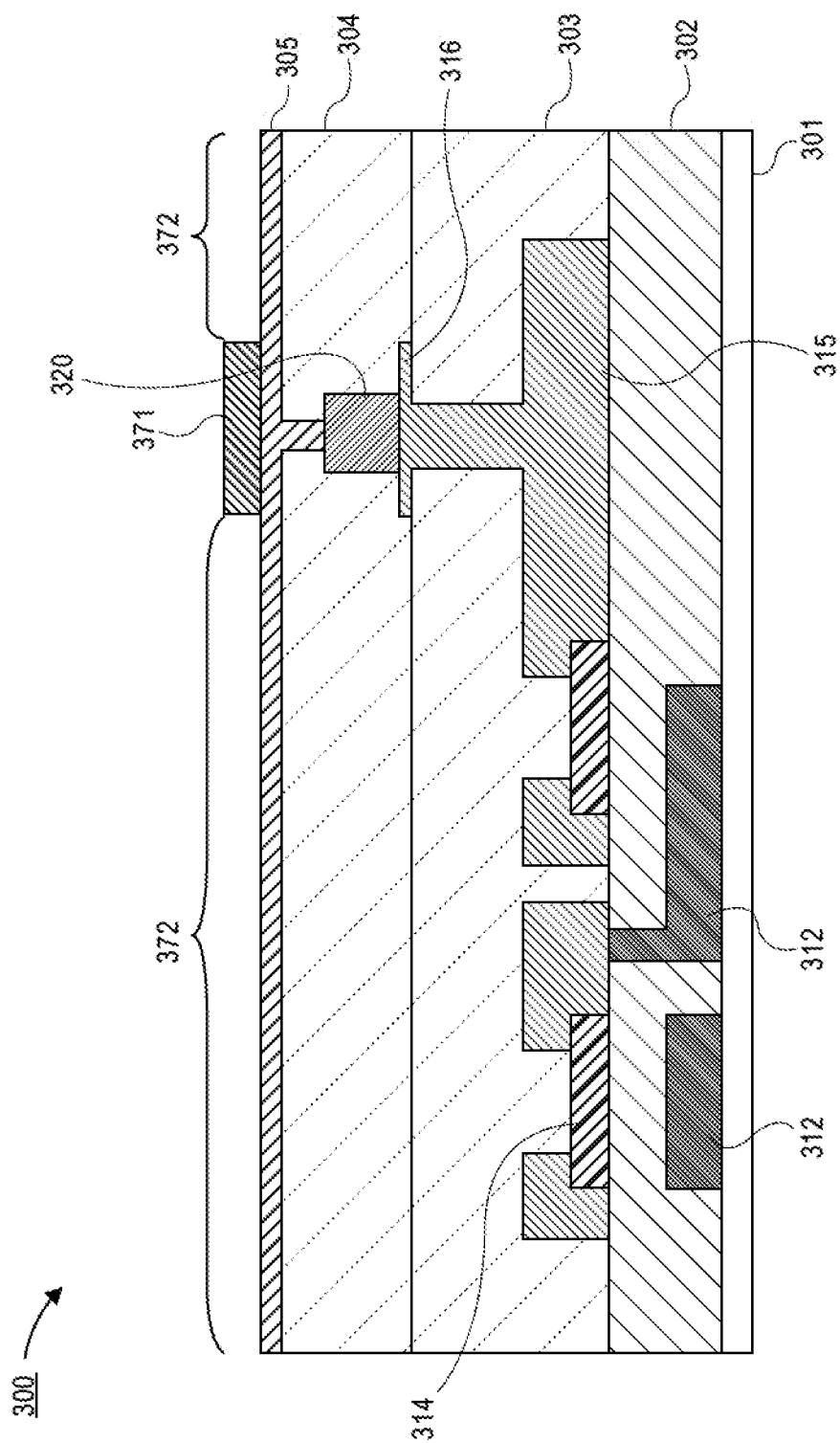

Referring now to FIG. 3B, a cross-sectional illustration of the display backplane 300 is shown after the color conversion material layer is patterned to form a color conversion device 371 directly over the micro LED 320. Accordingly, a majority of the color conversion material is removed (i.e., color conversion material in regions 372 are removed and, therefore, wasted). Due to the high cost of color conversion material and the high waste of the material, it is currently not cost effective to use such processes to improve the efficiency of micro LED displays. Furthermore, the color conversion device 371 is in direct contact with the transparent conductor 305, which may lead to negative interactions that reduce reliability.

Accordingly, embodiments disclosed herein include a method of forming a plurality of color conversion devices on a carrier substrate. The formation of a plurality of color conversion devices on a single substrate reduces the material waste. The plurality of color conversion devices may then be transferred to a display backplane with a laser transfer process that selectively deposits the color conversion devices on pre-specified coordinates on the display area.

In an embodiment, a pulsed laser beam is directed through a laser-transparent carrier substrate to strike a release layer coated on the opposite side of the carrier substrate on which the color conversion devices have been formed. The laser vaporizes the release layer material as it absorbs the laser radiation and, due to gravity, the color conversion device is locally removed from the carrier substrate and is deposited on a display backplane that is placed in proximity to the carrier substrate. In an embodiment, the release process may be performed in a vacuum chamber.

Referring now to FIGS. 4A-4D, cross-sectional illustrations depict a method of forming a plurality of color conversion devices on a carrier substrate, in accordance with an embodiment. In FIG. 4A, a cross-sectional illustration of a carrier substrate 429 is shown, in accordance with an embodiment. In an embodiment, the carrier substrate 429 may be a material that is transparent to the wavelength of a laser (e.g., an IR or UV laser) used to release the color conversion devices. For example, the carrier substrate 429 may be glass.

Referring now to FIG. 4B, a cross-sectional illustration after a release layer 430 is formed over the carrier substrate 429 is shown, in accordance with an embodiment. In an embodiment, the release layer 430 may be a material that is ablated (or otherwise damaged) by the laser. For example, the release layer 430 may be polymer, an amorphous silicon, or the like. In an embodiment, the release layer 430 may have a thickness that is between 1 nm and 50 nm.

Referring now to FIG. 4C, a cross-sectional illustration after a color conversion film 470 is deposited over the release layer 430 is shown, in accordance with an embodiment. In an embodiment, the color conversion film 470 may comprise any suitable color conversion system, such as quantum dots or nanophosphors, suitable for converting a first color light to a second color light. In an exemplary embodiment used to convert blue light to red light, the color conversion film may comprise InP. Those skilled in the art will recognize that other material systems may be used (e.g., to convert blue light to green, orange, or other color light). In an embodiment, the color conversion film 470 may be deposited with a spin coating process or the like.

Referring now to FIG. 4D, a cross-sectional illustration after the color conversion layer 470 is patterned to form a plurality of color conversion devices 471 is shown, in accordance with an embodiment. In an embodiment, the color conversion layer 470 may be a patterned with a lithographic process, or the like. In contrast to the process described above with respect to FIGS. 3A and 3B, there is significantly less color conversion material removed (i.e., regions 472) in FIG. 4D.

Figure 5A:
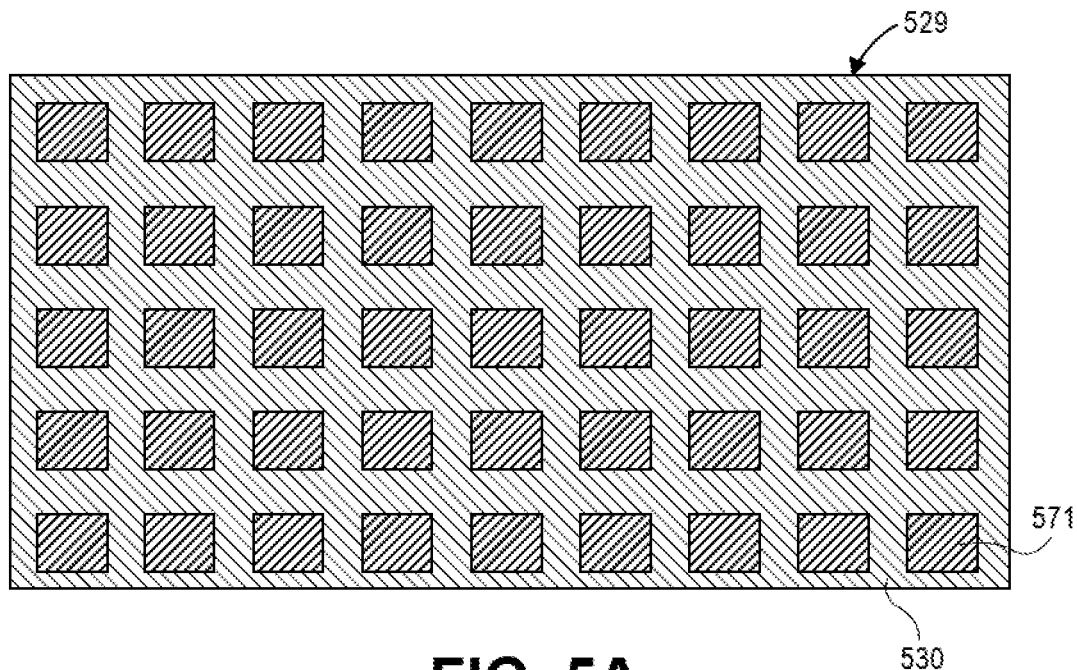
FIGS. 5A-5B are plan view illustrations of carrier substrate with a plurality of color conversion devices, in accordance with an embodiment.
Figure 5B:
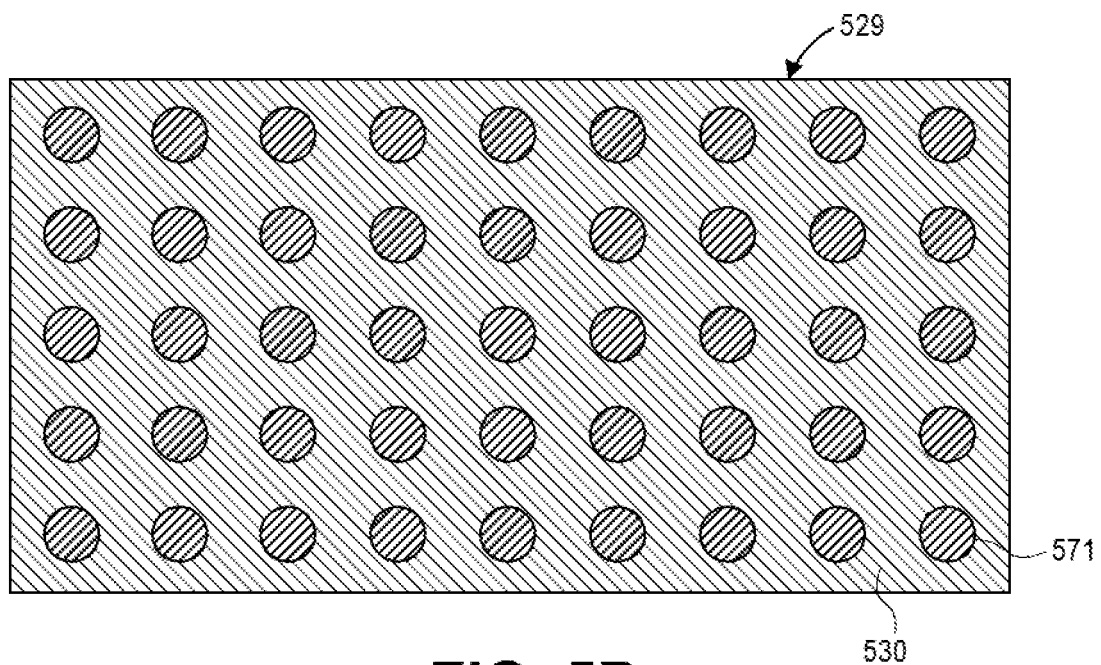

Referring now to FIG. 5A, a plan view illustration of color conversion devices 571 on a carrier substrate 529 is shown in accordance with an embodiment. In an embodiment, the color conversion devices 571 may have a dimension suitable to cover a single subpixel on a display backplane 530. For example, the color conversion devices 571 may have a surface area that is approximately 25 μm×25 μm or smaller. While the color conversion devices 571 are illustrated as having a substantially rectangular shape, it is to be appreciated that the color conversion devices 571 may have any suitable shape. For example, as shown in FIG. 5B, the color conversion devices 571 may have a circular shape.

In an embodiment, the plurality of color conversion devices 571 may be formed on a carrier substrate 529 that is substantially the same dimension as the display backplane 530 onto which the color conversion devices 571 will be transferred. In an embodiment, all of the color conversion devices 571 may be transferred onto a single display backplane 530. In an additional embodiment, a single carrier substrate 529 with a plurality of color conversion devices 571 may be used to populate a plurality of different display backplanes 530.

Figure 6B:
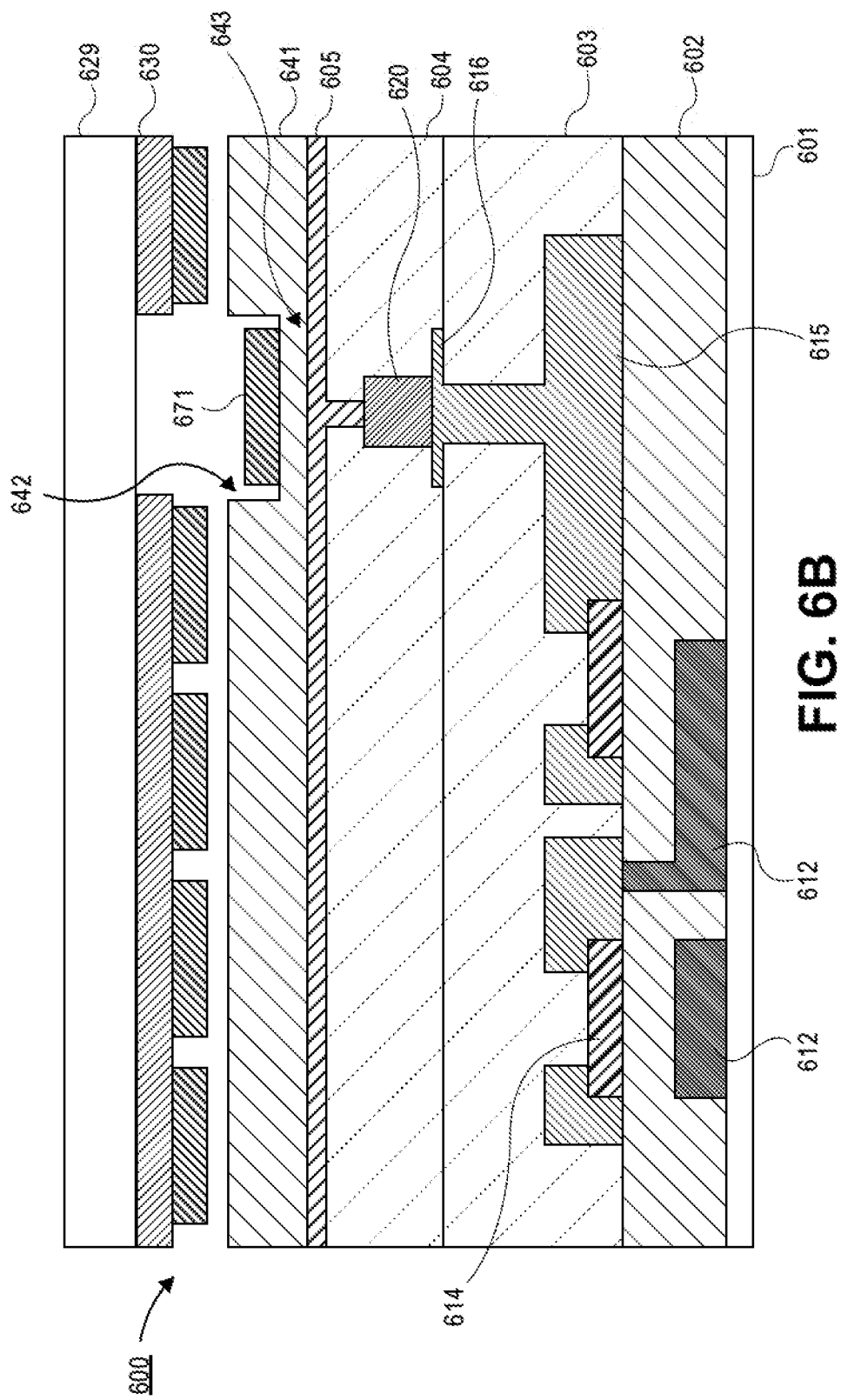
Figure 6C:
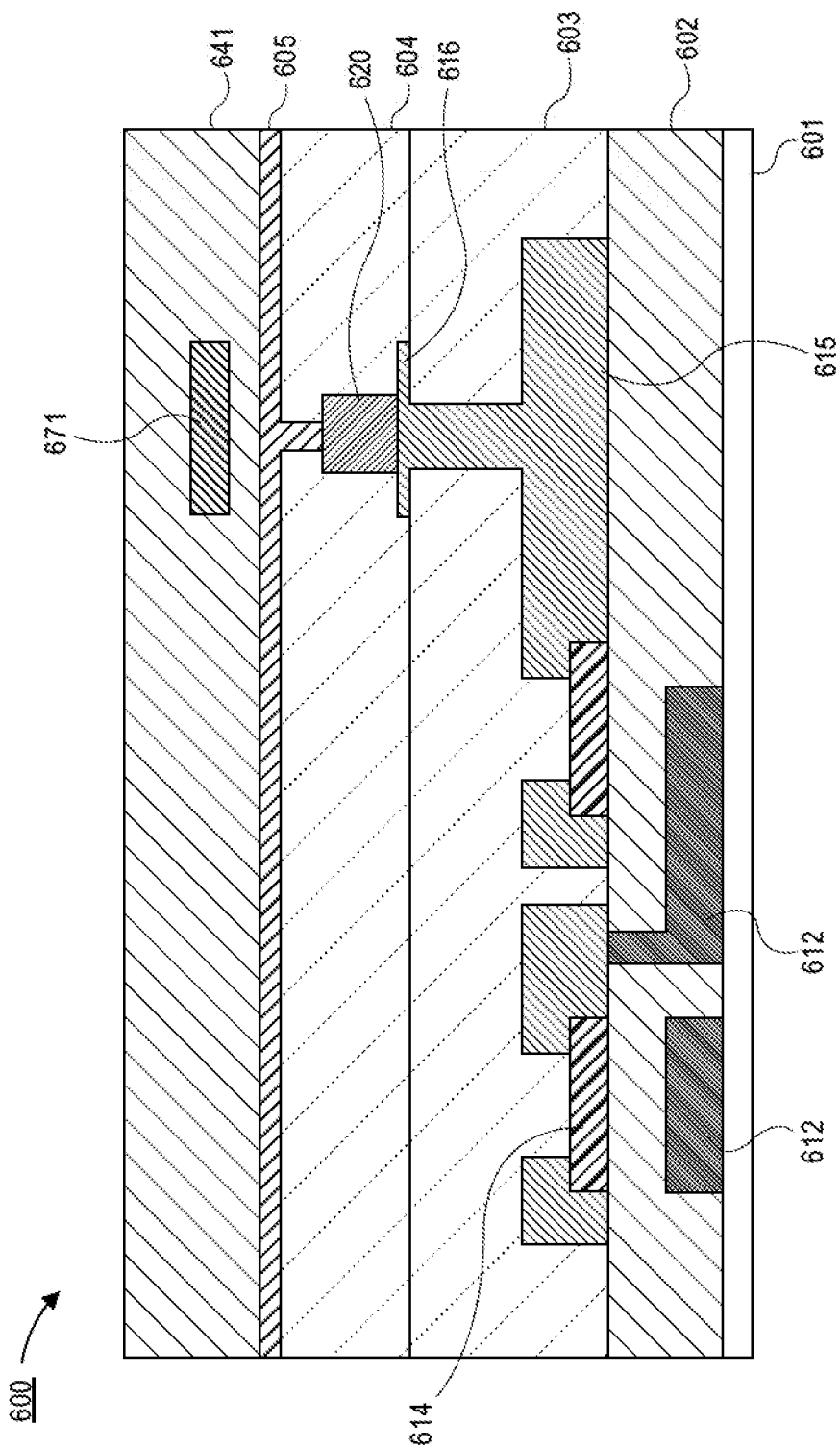

Referring now to FIGS. 6A-6C, cross-sectional illustrations depict a method of transferring color conversion devices 671 to a display backplane 600, in accordance with an embodiment. While a single color conversion device 671 is illustrated as being transferred, it is to be appreciated that up to all of the color conversion devices 671 needed for a display backplane 600 may be transferred substantially in parallel.

Referring now to FIG. 6A, a cross-sectional illustration of a display backplane 600 aligned with a carrier substrate 629 with a plurality of color conversion devices 671 is shown, in accordance with an embodiment. In an embodiment, the display backplane 600 may comprise a glass substrate 601 with pixel circuitry (e.g., gates 612 (surrounded by a gate oxide 602), thin film transistor (TFT) channels 614, and interconnects 615 in a dielectric 603) connected to a micro LED 620 on a reflective pad 616. The micro LED 620 may be surrounded by a dielectric 604 and connected to a transparent conductor 605 (e.g., ITO).

In an embodiment, the display backplane 600 may further include a dielectric layer 641 (e.g., $SiO_2$) formed over the transparent conductor 605. In an embodiment, a groove 642 may be formed into the dielectric layer 641. The groove 642 may be positioned over the micro LED 620 that will be covered by the color conversion device 671. While a single groove 642 is shown, it is to be appreciated that the number of grooves 642 on the display backplane 600 may be an integer multiple of the number of red subpixels on the display, an integer multiple of the number of green subpixels on the display, or an integer multiple of the number of green subpixels and red subpixels on the display. In an embodiment, the groove 642 may have a width $W_1$ that is greater than a width $W_2$ of the color conversion devices 671.

In the illustrated embodiment, a carrier substrate 629 is shown as being aligned in close proximity to the display backplane 600. As shown, one of the plurality of color conversion devices 671 is aligned so that it is over the groove 642. Once aligned, portions of the release layer 630 may be irradiated with radiation 635 (e.g., IR or UV radiation) from a laser source (not shown). Particularly, the portions of the release layer 630 contacting the color conversion device 671 to be released may be irradiated with radiation 635. In some embodiments, a single source of the radiation 635 may be used, and an optics module (described in greater detail below with respect to FIG. 9) may be used to distribute the radiation 635 to the desired locations. In FIG. 6A, the radiation 635 is distributed to a single color conversion device 671. However, it is to be appreciated that radiation 635 may be distributed to some or all of the color conversion devices 671 on the carrier substrate 629. For example, all of the color conversion devices 671 on a carrier substrate 629 may be released with a single processing operation in some embodiments.

In an embodiment, the radiation 635 may be pulsed. The pulse durations may be picosecond or femtosecond pulses. For example, the pulse durations may be between 10 femtoseconds and 1000 picoseconds. In an embodiment, the wavelength of the radiation 635 may be such that the radiation 635 passes through the carrier substrate 629. That is, the carrier substrate 629 may be transparent to the radiation 635. In an embodiment, the radiation is preferentially absorbed by the release layer 630. As such, the release layer 630 is weakened, ablated, vaporized, or the like.

Referring now to FIG. 6B, a cross-sectional illustration after the color conversion device 671 drops into the groove 642 is shown, in accordance with an embodiment. As shown, the color conversion device 671 may sit entirely within the groove 642. The groove 642 may aid in ensuring that the color conversion device 671 is properly aligned over the micro LED 620. In an embodiment, the color conversion device 671 is separated from the transparent conductor 605 by a portion 643 of the dielectric layer 641. As such, negative interactions between the conductor 605 and the color conversion device 671 are limited (or eliminated). In the illustrated embodiment, not all of the color conversion devices 671 are released. In such embodiments, remaining color conversion devices 671 may be aligned with different display backplanes.

Figure 7A:
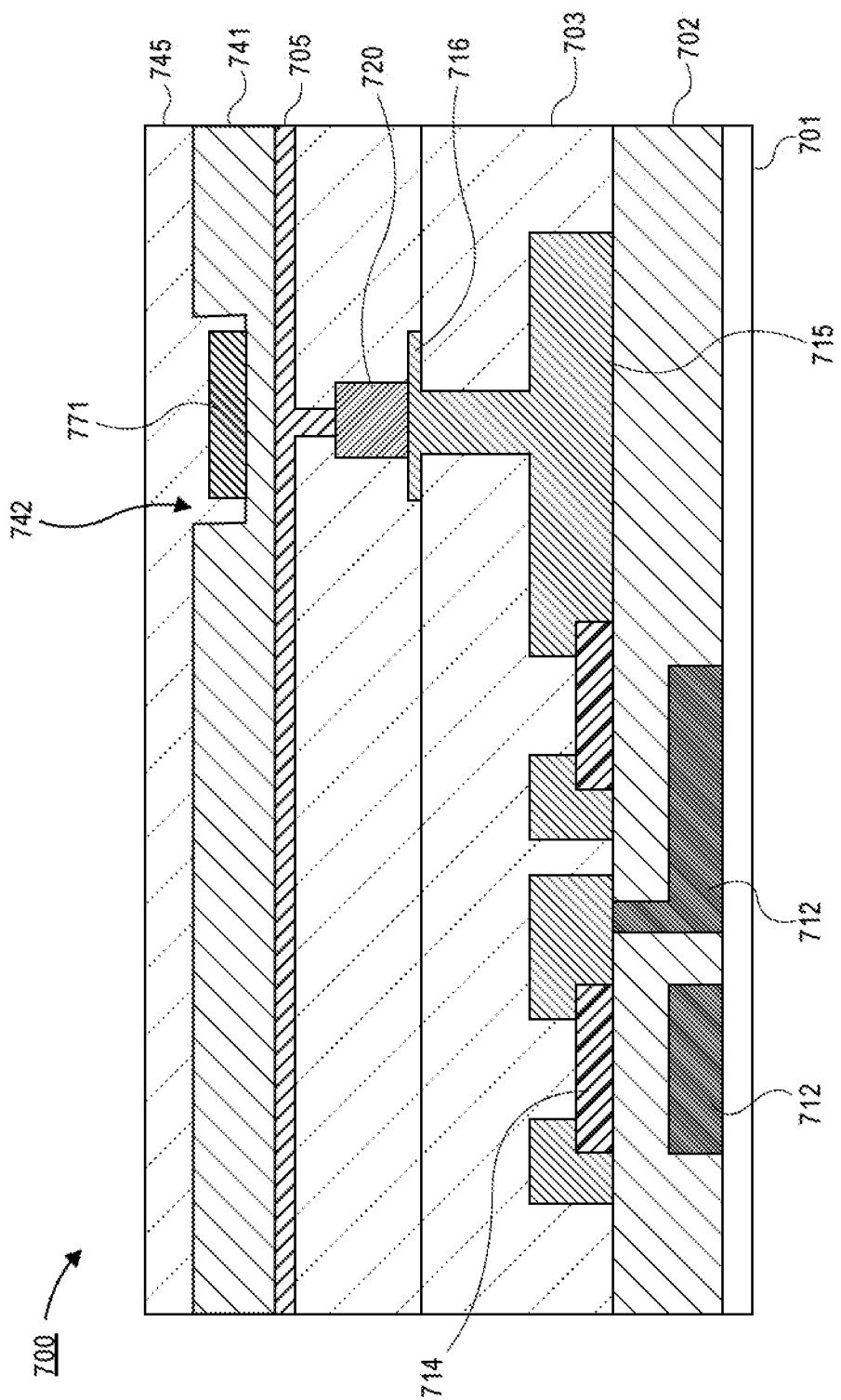
FIGS. 7A-7B are cross-sectional illustrations of a display backplane substrate with a color conversion device, in accordance with additional embodiments.

Referring now to FIG. 6C, a cross-sectional illustration after the color conversion device 671 is encapsulated with a sealant is shown, in accordance with an embodiment. In an embodiment, the sealant may be the same material as the dielectric layer 641. In such embodiments, there may be no discernable trace of the groove. Instead, the color conversion device 671 may appear as fully embedded on all surfaces by the dielectric layer 641. However, embodiments are not limited to such configurations, as will be described with respect to FIGS. 7A and 7B below.

In an embodiment, the color conversion device 671 may be annealed and/or cleaned subsequent to transfer from the carrier substrate 629. For example, a cleaning and/or annealing may be implemented to remove unwanted elements (e.g., a carrier liquid) and/or to densify/cure the color conversion device 671.

In the exemplary embodiment depicted in FIG. 6A-6C, a single subpixel is shown in order to not obscure the disclosed embodiments. However, those skilled in the art will recognize that substantially similar processing operations may be used to form a pixel element that includes one or more color conversion devices 671.

Figure 6D:
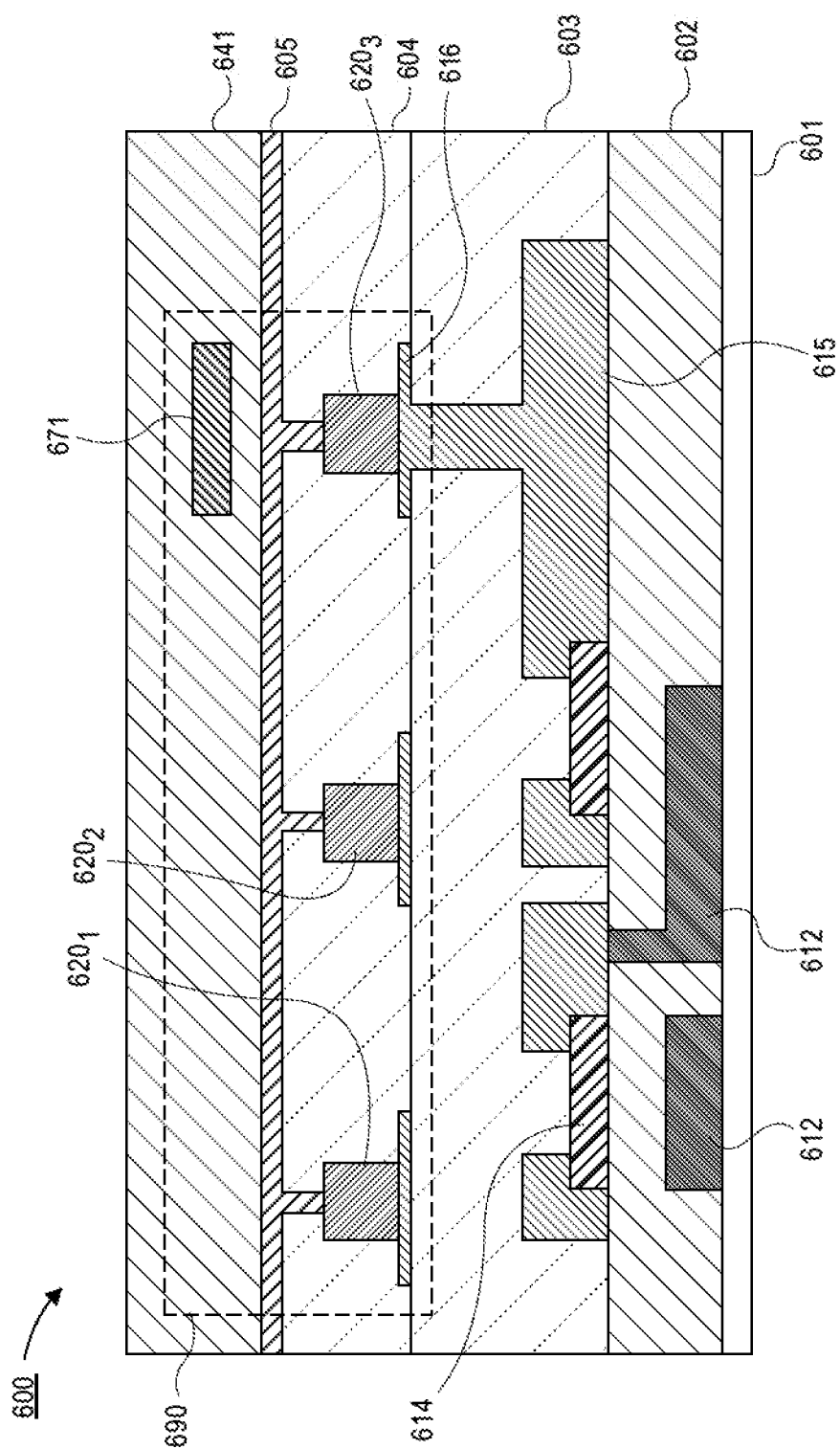
FIGS. 6D-6E are cross-sectional illustrations of a pixel element of a display backplane that includes at least one color conversion device, in accordance with an embodiment.

Referring now to FIG. 6D, a cross-sectional illustration of a pixel element 690 (e.g., a pixel comprising a green subpixel, a blue subpixel, and a red subpixel) is shown. In an embodiment, the green subpixel may comprise a green micro LED $620_1$, the blue subpixel may comprise a blue micro LED $620_2$, and the red subpixel may comprise a blue micro LED $620_3$ and a red color conversion device 671.

Although the pixel element 690 is shown as three different micro LEDs across (e.g., green, blue, blue with a red color conversion device, from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 6D. In another embodiment, four micro LEDs are arranged a 2×2 arrangement. In another embodiment, nine micro LEDs are arranged a 3×3 arrangement (three green micro LEDs, three blue micro LEDs, and three blue micro LEDs with corresponding red color conversion devices), etc.

Figure 6E:
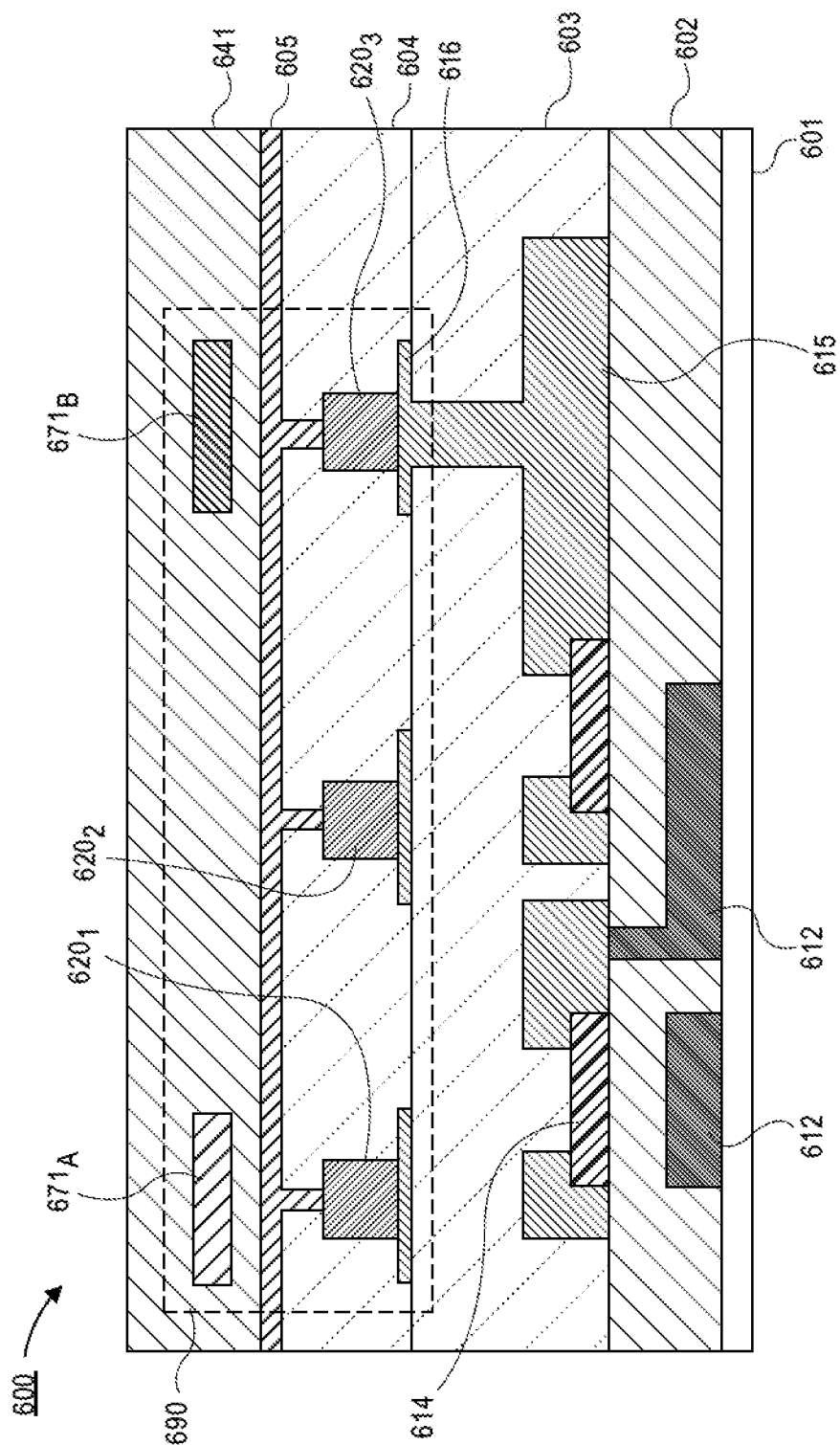

Referring now to FIG. 6E, a cross-sectional illustration of a pixel element 690 of a display backplane 600 is shown in accordance with an additional embodiment. In an embodiment, the display backplane 600 may comprise more than one type of color conversion device 671. For example, a green subpixel may comprise a blue micro LED $620_1$ and a green color conversion device $671_A$, the blue subpixel may comprise a blue micro LED $620_2$, and the red subpixel may comprise a blue micro LED $620_3$ with a red color conversion device $671_B$. Such embodiments may be particularly beneficial since only a single type of micro LED needs to be fabricated. Furthermore, while a green color conversion device $671_A$ and a red color conversion device 671E are shown, those skilled in the art will recognize that additional color conversion devices (e.g., a blue to orange color conversion device) may also be included depending on the needs of the pixel element 690.

Figure 7B:
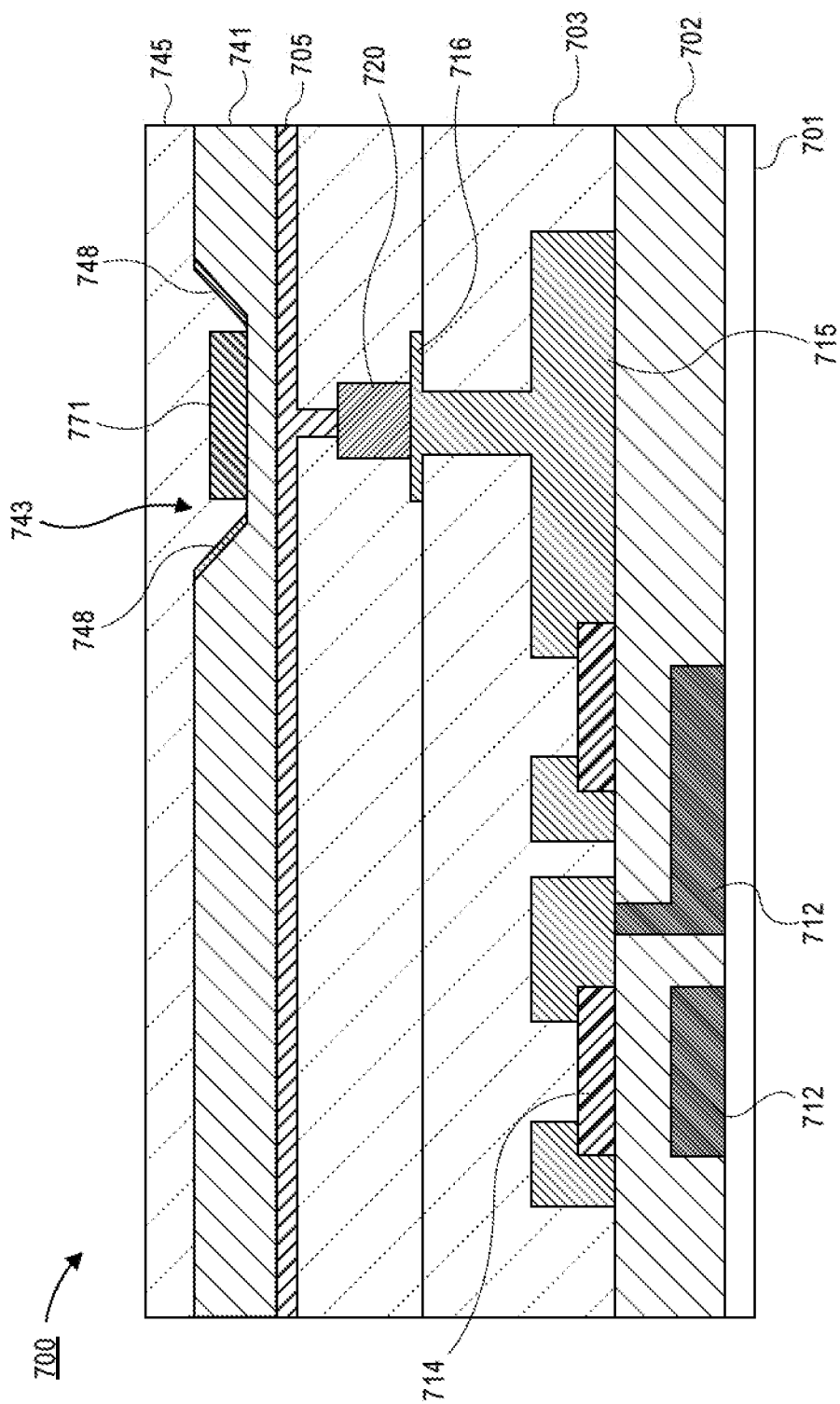

As noted above, the color conversion device may be encapsulated with different sealants. For example, in FIG. 7A, a sealant layer 745 that is a different material than the dielectric layer 741 may be deposited over the color conversion device 771 and the dielectric layer 741. In an embodiment, the sealant layer 745 may have a refractive index that is less than the refractive index of the dielectric layer 741 in order to improve light extraction efficiency (e.g., by providing an index of refraction matching gradient that decreases total internal reflections). In such an embodiment, the cavity 742 may be detectable in a cross-section since there will be an interface between the sealant 745 and the dielectric layer 741. In yet another embodiment, the color conversion device 771 may sit in a cavity 743 that has sidewalls 748 that are engineered to improve light extraction efficiency, as shown in FIG. 7B. For example, the sidewalls 748 may be tapered and/or may include a reflective layer to increase light extraction.

Figure 8:
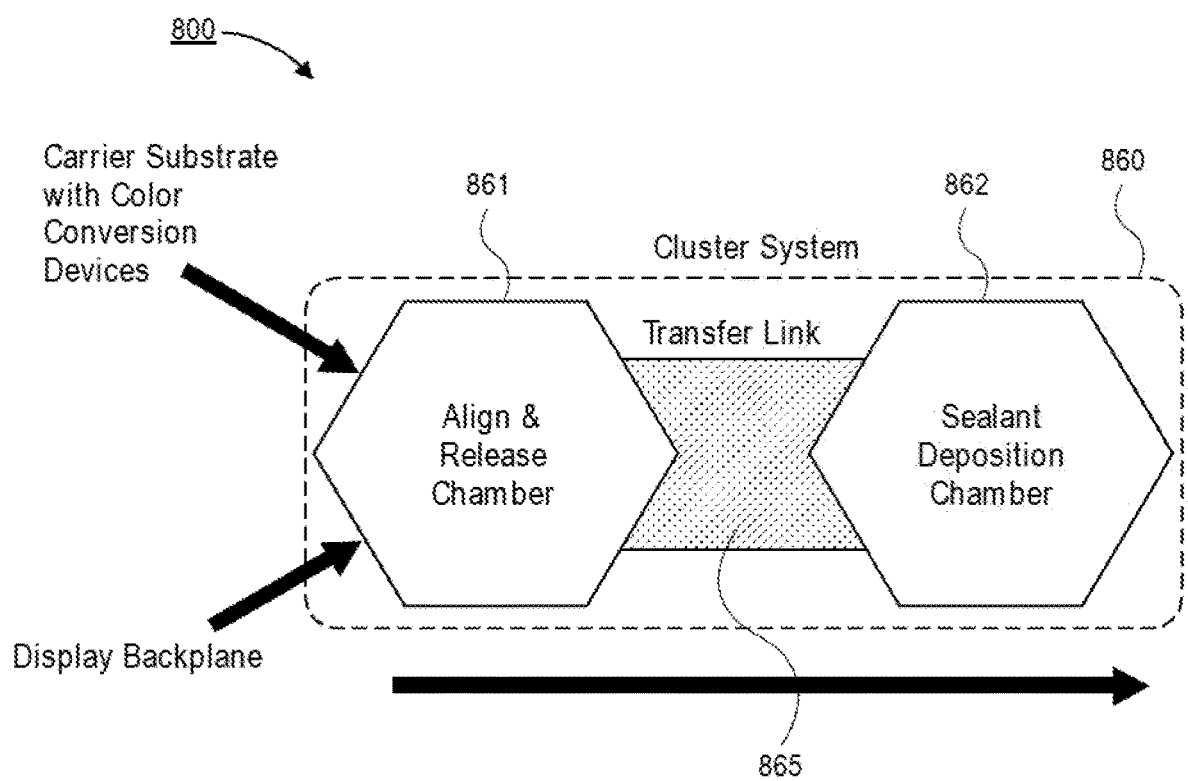
FIG. 8 is a flow diagram illustrating a micro-LED display production line, in accordance with an embodiment.

While the process flow described above with respect to FIGS. 6A-6C may be implemented with any suitable processing equipment, another aspect of embodiments of the present disclosure include a processing tool that may be used to fabricate LED backplanes. FIG. 8 is a schematic illustration of a processing line 800 that may be used in some embodiments.

In an embodiment, process line 800 may include a cluster system 860. The cluster system 860 may include any number of chambers and transfer links between the chambers. For example, a first chamber 861 may be connected to a second chamber 862 by a transfer link 865. In an embodiment, the first chamber 861 may be an align-and-release chamber and the second chamber 862 may be a sealant deposition chamber.

In an embodiment, the align-and-release chamber 861 may receive a carrier substrate (e.g., a glass substrate with a plurality of color conversion devices attached by a release layer, such as described above) and a display backplane (e.g., a backplane substrate with a plurality of micro LEDs and grooves for receiving color conversion devices, such as described above). The align-and-release chamber 861 may then align the carrier substrate to the display backplane and release the color conversion devices formed on the carrier substrate onto the display backplane (e.g., similar to the process described above with respect to FIGS. 6A and 6B).

After the color conversion devices are released onto the display backplane, the cluster tool 860 may deliver the display backplane to the sealant deposition chamber 862 via transfer link 865. In the sealant deposition chamber 862, a sealant layer may be deposited over the color conversion devices (e.g., similar to the sealant layer deposited in FIG. 6C or 7A). At this point, the color conversion devices are sealed and affixed to the display backplane. As such, they may be removed from the cluster tool 860 and delivered to subsequent processing tools in the line 800.

While a cluster tool 860 with a first chamber 861 and a second chamber 862 is shown, it is to be appreciated that any number of processing tools used to implement the process of forming a display backplane (e.g., such as the process described with respect to FIGS. 6A-6C) may be integrated into a cluster tool. Additional embodiments may include a plurality of distinct processing tools that are used to assemble the display backplane.

In another aspect of embodiments of the present disclosure, an aligner and release chamber for directly transferring color conversion devices from a carrier substrate to a display backplane is described. An example of such a processing chamber is described with respect to the cross-sectional view of a schematic of a processing tool 961 illustrated in FIG. 9.

Figure 9:
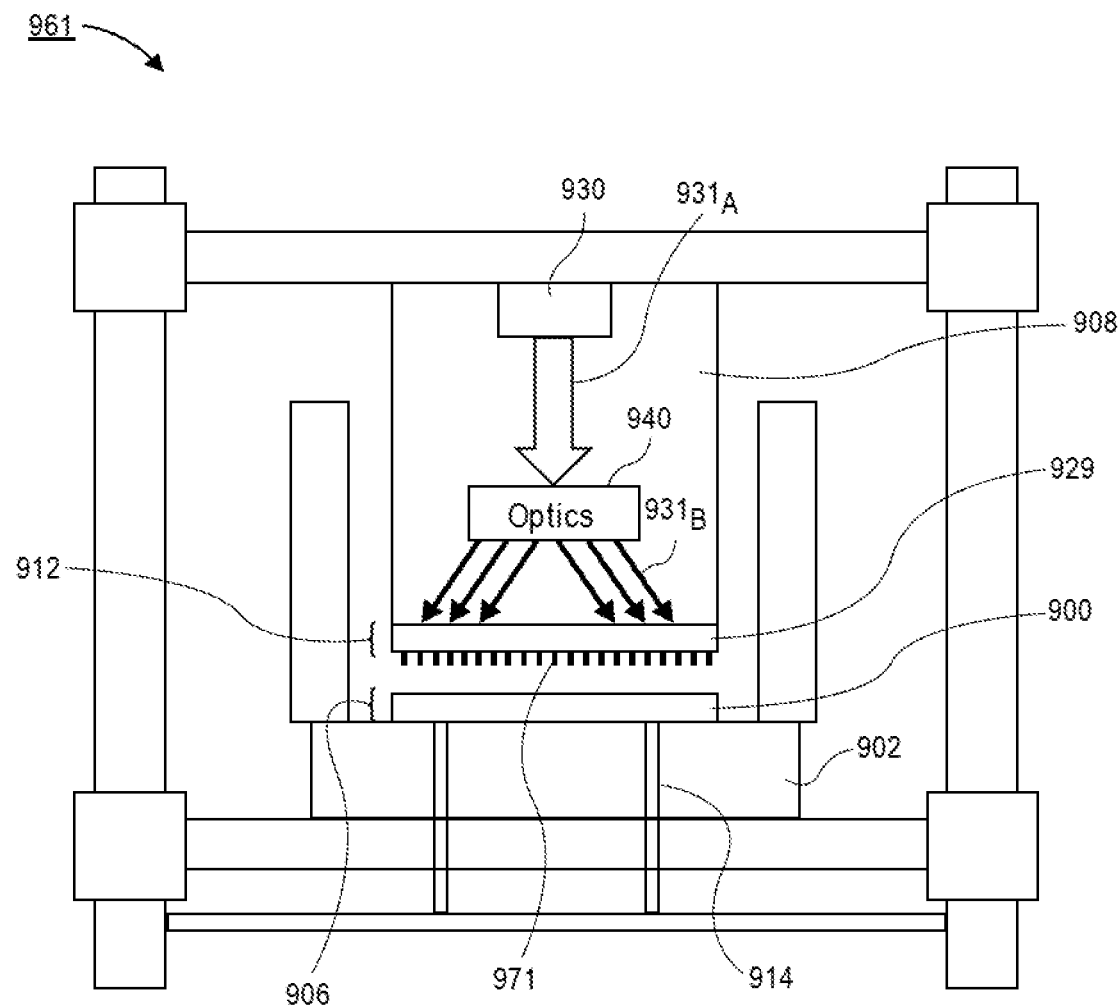
FIG. 9 is a cross-sectional illustration of a schematic of a display aligner and release chamber for transferring color conversion devices to a display backplane substrate, in accordance with an embodiment.

Referring to FIG. 9, a processing tool 961 includes a first support 902 for holding a display backplane substrate 900 in a first position 906. A second support 908 is for holding a carrier substrate 929 in a second position 912. The second position 912 is over the first position 906. In one embodiment, a piston 914 is coupled to the first support 902. The piston 914 is for moving the display backplane substrate 900 from the first position 906 toward the second position 912. The first support 902 may also be configured to provide lateral displacement of the display backplane substrate 900. In an embodiment, the second support 908 may also be configured to provide lateral and vertical displacement of the carrier substrate 929. In an embodiment, the alignment of the display backplane substrate 900 relative to the carrier substrate 929 may be performed using infrared imaging, optical, or mechanical approaches. The processing tool may be provided with a vacuum chamber (or any controlled atmosphere).

In an embodiment, the processing tool 961 may comprise a laser source 930 for emitting radiation $931_A$ (e.g., IR or UV radiation). An optics module 940 may be located between the laser source 930 and the carrier substrate 929. In an embodiment, the optics module 940 may comprise optics components (e.g., splitters, mirrors, prisms, lenses, etc.) to distribute and focus a plurality of optical pathways $931_B$ between the optics module 940 and the carrier substrate 929. While six optical pathways 931E from a single optics module 940 are shown in FIG. 9, it is to be appreciated that any number of optical pathways $931_B$ from each optics module 940, and/or more than one optics module 940 may be used. In some embodiments, the number of optical pathways $931_B$ may be equal to the number of color conversion devices 971 attached to the carrier substrate 929. The optical pathways $931_B$ provide a focused spot of laser radiation (e.g., femtosecond or nanosecond pulses of laser radiation) that ablates (or otherwise deteriorates) a release layer (not shown) that secures the color conversion devices 971 to the carrier substrate 929. After the release layer is ablated, the color conversion devices 971 are released to drop into grooves (not shown) on the underlying display backplane substrate 900, as described in greater detail above with respect to FIGS. 6A-6C.

In some embodiments, the processing tool 961 may be suitable for transferring color conversion devices from one carrier substrate 929 onto a plurality of display backplanes 900. For example, a first group of color conversion devices 971 on the carrier substrate 929 may be released onto a first display backplane 900 (i.e., all color conversion devices 971 for a single display backplane 900 may be released in parallel) and the first display backplane 900 may be removed from the processing tool 961. Thereafter, a second display backplane 900 may be inserted into the processing tool 961 and aligned with a second group of color conversion devices 971 on the carrier substrate 929. The second group of color conversion devices 971 may then be released onto the second display backplane 900.

Since the transfer of all needed color conversion devices 971 onto a single display backplane substrate 900 may be implemented substantially in parallel, the throughput (i.e., displays per hour) is incredibly high, even for extremely large displays (e.g., Gen 5 and larger).

Up until this point, the micro LEDs have been described as generic blocks. It is to be appreciated that the scope of embodiments described herein are not limited to any particular micro LED structure. However, FIGS. 10A-10D provide exemplary illustrations of some micro LEDs that may be used in conjunction with embodiments disclosed herein. The micro LEDs illustrated in FIG. 10A-10D are shown as grown on a silicon wafer. Such LED devices may be transferred to the display backplane using direct (e.g., wafer-to-backplane) or indirect (e.g., pick-and-place) processes.

Figure 10A:
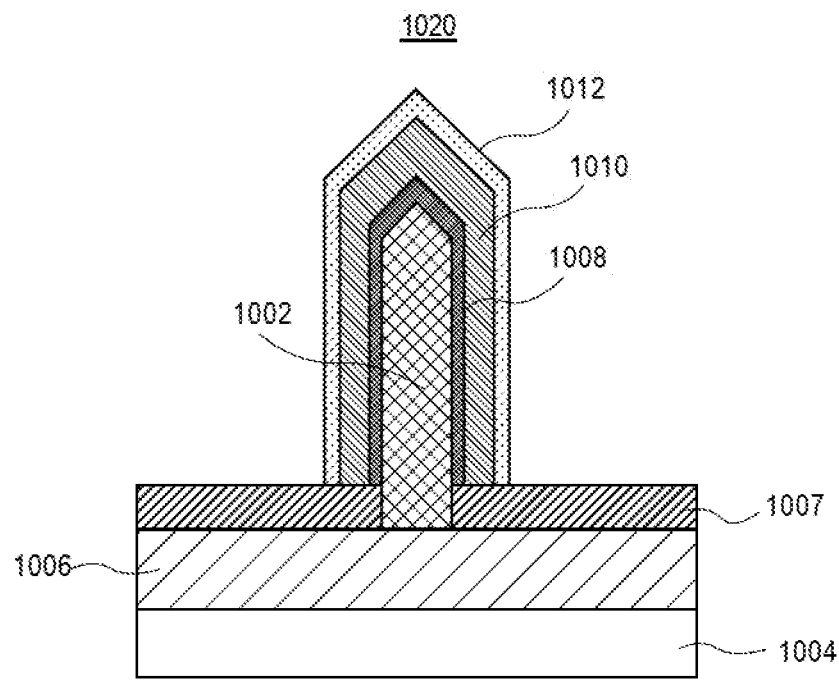
FIGS. 10A-10D are cross-sectional illustrations of micro LEDs that may be used in display backplanes in accordance with an embodiment.

FIG. 10A illustrates a cross-sectional view of a GaN nanowire based LED highlighting certain layers of the LED, in accordance with an embodiment of the present disclosure. In the exemplary embodiment of FIG. 10A, an LED 1020 includes an n-type GaN nanowire 1002 above a substrate 1004, which may be a silicon substrate. An intervening release layer 1006 has an opened mask layer 1007 thereon. An active layer 1008/1010 (which may be a single active layer replacing 1008/1010) is included on the n-type GaN nanowire 1002. In a particular embodiment, an $In_{0.2}Ga_{0.8}N$ shell "buffer" layer 1008 is included on the n-type GaN nanowire 1002, and an active $In_{0.4}Ga_{0.6}N$ layer 1010 is included on the $In_{0.2}Ga_{0.8}N$ shell "buffer" layer 1008. In one such embodiment, the $In_{0.4}Ga_{0.6}N$ layer 1010 emits red color (e.g., having a wavelength in the range of 610-630 nanometers). Those skilled in the art will recognize that other colors may be emitted (e.g., $In_{0.2}Ga_{0.8}N$ emits blue light and $In_{0.3}Ga_{0.7}N$ emits blue light). A p-GaN or p-ZnO cladding layer 1012 is included on the active layer 1008/1010.

In another such embodiment, following the fabrication of an ordered n-type $In_xGa_{1-x}N$ nanowire array with x in the range of 0.15-0.25, the remainder of the LED structure is grown radially around the nanowires. An $In_yGa_{1-y}N$ layer is on the $In_xGa_{1-x}N$ nanowires (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 10B:
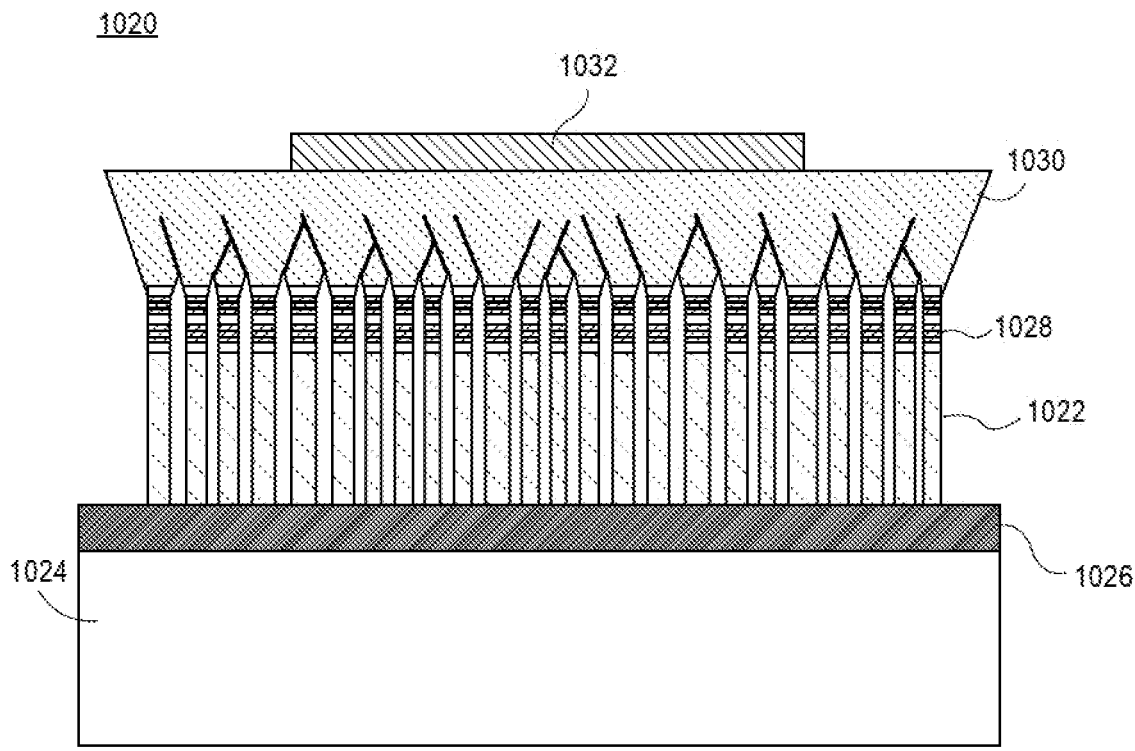

FIG. 10B illustrates a cross-sectional view of a micro-LED composed of multiple nanowire LEDs, in accordance with an embodiment of the present disclosure. In the exemplary embodiment of FIG. 10B, a micro-LED 1020 includes an n-GaN nano-column 1022 above a substrate 1024, which may be a silicon substrate. An intervening release layer 1026 is included between the n-GaN nano-column 1022 and the substrate 1024. An InGaN/GaN multi-quantum well device (MQD) stack 1028 is included on the n-GaN nano-column 1022. A p-GaN layer 1030 is on the multi-quantum well device (MQD) stack 1028. A transparent p-electrode 1032 is included on the p-GaN layer 1030.

It is to be appreciated that foundational geometries other than the above described nanowires may be used for LED fabrication. For example, in another embodiment, FIG. 10C illustrates a cross-sectional view of a GaN nanopyramid or micropyramid based LED highlighting certain layers of the LED, in accordance with an embodiment of the present disclosure. In the exemplary embodiment of FIG. 10C, an LED 1020 includes an n-GaN nanopyramid 1042 above a substrate 1044, which may be a silicon substrate. An intervening release layer 1045 has an opened mask layer 1047 thereon. An InGaN layer 1048 is included on the n-GaN nanopyramid 1042. A p-GaN or p-ZnO cladding layer 1052 is included on the InGaN layer 1048. It is to be appreciated that a micro LED may be composed of multiple nanopyramids connected in parallel. For example, a 5 μm×5 μm micro LED may be composed of 20 nanopyramids.

Figure 10D:
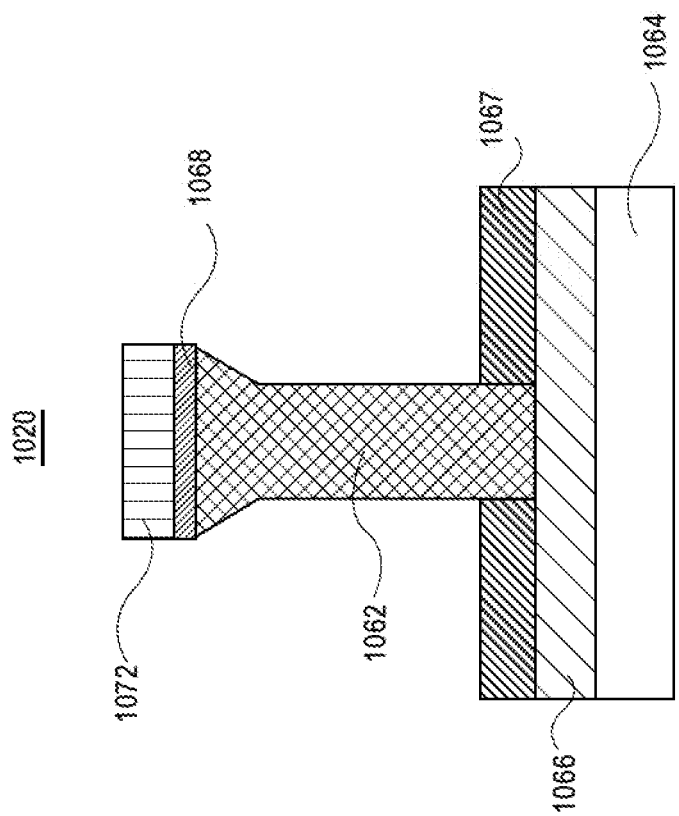
Figure 10C:
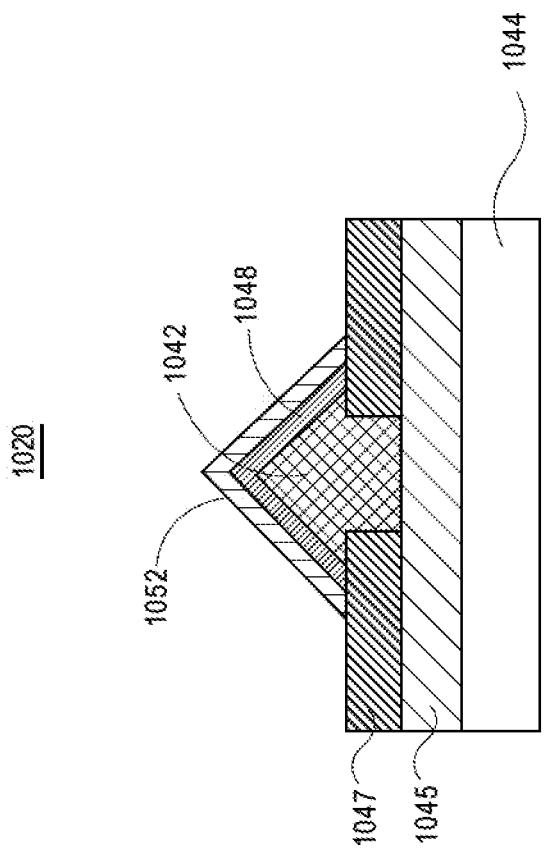

In another embodiment, FIG. 10D illustrates a cross-sectional view of a GaN axial nanowire based LED highlighting certain layers of the LED, in accordance with an embodiment of the present disclosure. In the exemplary embodiment of FIG. 10D, an LED 1020 includes an n-GaN axial nanowire 1062 above a substrate 1064, which may be a silicon substrate. An intervening release layer 1066 has an opened mask layer 1067 thereon. An InGaN layer 1068 is included on the n-GaN axial nanowire 1062. A p-GaN or p-ZnO cladding layer 1072 is included on the InGaN layer 1068.

While explicit reference is made to color conversion devices in use with micro LEDs, it is to be appreciated that embodiments are not limited to such configurations. For example, display technologies with any emission source (e.g., OLED) may also benefit from the use of color conversion devices such as those described herein and methods of transferring such color conversion devices onto the display backplane.

Figure 11:
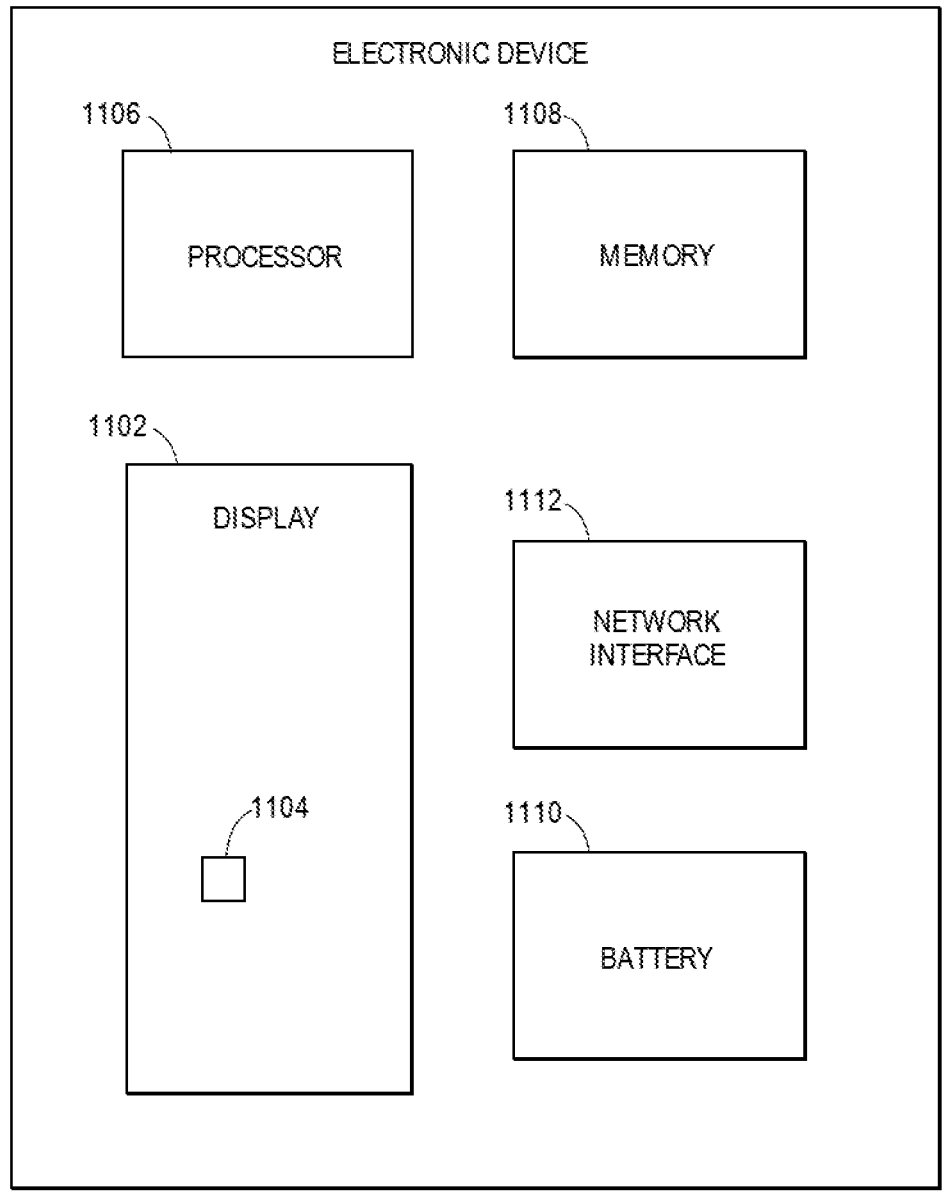
FIG. 11 is an electronic device having a display, in accordance with an embodiment.

FIG. 11 is an electronic device having a display, in accordance with embodiments of the present disclosure. Referring to FIG. 11, an electronic device 1100 has a display or display panel 1102 with a micro-structure 1104. The display may also have glass layers and other layers, circuitry, and so forth. The display panel 1102 may be a micro-LED display panel. As should be apparent, only one microstructure 1104 is depicted for clarity, though a display panel 1102 will have an array or arrays of microstructures including nanowire LEDs.

The electronic device 1100 may be a mobile device such as smartphone, tablet, notebook, smartwatch, and so forth. The electronic device 1100 may be a computing device, stand-alone display, television, display monitor, vehicle computer display, the like. Indeed, the electronic device 1100 may generally be any electronic device having a display or display panel.

The electronic device 1100 may include a processor 1106 (e.g., a central processing unit or CPU) and memory 1108. The memory 1108 may include volatile memory and non-volatile memory. The processor 1106 or other controller, along with executable code store in the memory 1108, may provide for touchscreen control of the display and well as for other features and actions of the electronic device 1100.

In addition, the electronic device 1100 may include a battery 1110 that powers the electronic device including the display panel 1102. The device 1100 may also include a network interface 1112 to provide for wired or wireless coupling of the electronic to a network or the internet.

Wireless protocols may include Wi-Fi (e.g., via an access point or AP), Wireless Direct®, Bluetooth®, and the like. Lastly, as is apparent, the electronic device 1100 may include additional components including circuitry and other components.

Thus, embodiments described herein include micro light-emitting diode (LED) fabrication and assembly.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a display panel, comprising: a display backplane substrate; a light emitting element on the display backplane; a transparent conductor over the light emitting element; a dielectric layer over the transparent conductor; and a color conversion device over the light emitting element, wherein the dielectric layer separates the transparent conductor from the color conversion device.

Example 2: the display panel of Example 1, wherein the light emitting element is a micro-light emitting diode (LED).

Example 3: the display panel of Example 1 or Example 2, wherein the light emitting element is an organic light emitting diode (OLED).

Example 4: the display panel of Examples 1-3, wherein the light emitting element emits blue light, and wherein the color conversion device converts the blue light to red light, green light, or orange light.

Example 5: the display panel of Examples 1-4, wherein the color conversion device comprises quantum dots or nanophosphors.

Example 6: the display panel of Examples 1-5, wherein the dielectric layer comprises a groove, and wherein the color conversion device is within the groove.

Example 7: the display panel of Examples 1-6, wherein sidewalls of the groove comprise a reflective layer.

Example 8: the display panel of Examples 1-7, further comprising: a sealant over the dielectric layer, wherein sealant covers the color conversion device.

Example 9: the display panel of Examples 1-8, wherein the sealant has a refractive index that is less than a refractive index of the dielectric layer.

Example 10: a micro-light emitting diode (LED) display panel, comprising: a display backplane substrate having a first dielectric layer; an LED pixel element over the dielectric layer, wherein the LED pixel element comprises a first micro-LED that emits a first color light, and second micro-LEDs that emits a second color light, and a third micro-LED that emits the second color light; a transparent conductor over the LED pixel element; a second dielectric layer over the transparent conductor; and a color conversion device over the third micro-LED, wherein the color conversion device converts the second color light to a third color light.

Example 11: the micro-LED display panel of Example 10, wherein the first color is green, the second color is blue, and the third color is red.

Example 12: the micro-LED display panel of Example 10 or Example 11, wherein the color conversion device is positioned in a groove in the second dielectric layer.

Example 13: the micro-LED display panel of Examples 10-12, wherein sidewalls of the groove comprise a reflective layer.

Example 14: the micro-LED display panel of Examples 10-13, wherein the first micro-LED, the second micro-LED, and the third micro-LEDs are nanowire LEDs or nanopyramid LEDs.

Example 15: a method of manufacturing a micro-light emitting diode (LED) display panel, the method comprising: positioning a carrier substrate above a display backplane, wherein the carrier substrate comprises a release layer and a plurality of color conversion devices over the release layer, and wherein the display backplane comprises a pixel element with a groove above at least one subpixel of the pixel element; aligning the carrier substrate with the display backplane substrate, wherein at least one of the plurality of color conversion devices is over and above the groove; and ablating a portion of the release layer, wherein ablating the portion of the release layer separates the at least one color conversion device from the carrier substrate, and wherein the color conversion device falls into the groove.

Example 16: the method of Example 15, wherein ablating the portion of the release layer comprises irradiating the portion of the release layer with an IR or UV laser.

Example 17: the method of Example 15 or Example 16, wherein the IR or UV laser is pulsed with pulses having a duration between 10 femtoseconds and 100 picoseconds.

Example 18: the method of Examples 15-17, wherein the laser energy us between 10 $mJ/cm^2$ and 10 $J/cm^2$.

Example 19: the method of Examples 15-18, further comprising: forming the plurality of color conversion devices on the carrier substrate.

Example 20: the method of Examples 15-19, wherein forming the plurality of color conversion devices on the carrier substrate, comprises: disposing a color conversion layer on the release layer; and patterning the color conversion layer to form a plurality of color conversion devices.

Example 21: the method of Examples 15-20, wherein the plurality of color conversion devices are circular shaped or rectangular shaped.

Example 22: the method of Examples 15-21, wherein the carrier substrate is substantially the same size as the display backplane.

Example 23: a processing chamber, comprising: a chamber; a first support in the chamber for supporting a display backplane substrate; a second support in the chamber for supporting a carrier substrate, wherein the carrier substrate comprises a plurality of color conversion devices attached to the carrier substrate by a release layer; a laser source; and an optics module, wherein the optics module receives laser radiation from the laser source and distributes the laser radiation to a plurality of locations on the carrier substrate supported by the second support.

Example 24: the processing chamber of Example 23, wherein the first support is capable of supporting generation 5 glass substrates or larger.

Example 25: the processing chamber of Example 23 or Example 24, wherein the optics module distributes the laser radiation to a number of locations on the carrier substrate that is equal to a number of color conversion devices attached to the carrier substrate.

What is claimed is:

1. A method of manufacturing a micro-light emitting diode (LED) display panel, the method comprising:

positioning a carrier substrate above a display backplane, wherein the carrier substrate comprises a release layer and a plurality of color conversion devices over the release layer, and wherein the display backplane comprises a pixel element with a groove above at least one subpixel of the pixel element;

aligning the carrier substrate with the display backplane substrate, wherein at least one of the plurality of color conversion devices is over and above the groove; and ablating a portion of the release layer, wherein ablating the portion of the release layer separates the at least one color conversion device from the carrier substrate, and wherein the color conversion device falls into the groove.

2. The method of claim 1, wherein ablating the portion of the release layer comprises irradiating the portion of the release layer with an IR or UV laser.

3. The method of claim 2, wherein the IR or UV laser is pulsed with pulses having a duration between 10 femtoseconds and 100 picoseconds.

4. The method of claim 2, wherein the laser energy us between 10 mJ/cm$^2$ and 10 J/cm$^2$.

5. The method of claim 1, further comprising:

forming the plurality of color conversion devices on the carrier substrate.

6. The method of claim 5, wherein forming the plurality of color conversion devices on the carrier substrate, comprises:

disposing a color conversion layer on the release layer; and patterning the color conversion layer to form the plurality of color conversion devices.

7. The method of claim 6, wherein the plurality of color conversion devices are circular shaped or rectangular shaped.

8. The method of claim 1, wherein the carrier substrate is substantially the same size as the display backplane.

* * * * *